June 9, 1953 W. L. CARLSON 2,641,708

VARIABLE RESONANT STRUCTURE

Filed March 29, 1950

Inventor
WENDELL L. CARLSON

By H. L. Newton

Attorney

Patented June 9, 1953

2,641,708

UNITED STATES PATENT OFFICE 2,641,708

VARIABLE RESONANT STRUCTURE

Wendell L. Carlson, Princeton, N. J., assignor to Radio Corporation of America, a corporation of Delaware Application March 29, 1950, Serial No. 152,607

9 Claims. (Cl. 250—40)

This invention relates to high frequency tuners for radio and other electrical circuits, and has for its primary object an improved variably resonant structure which is tunable over an extended high frequency range or a series of frequency ranges substantially continuously from one to another.

At the present time, several channels have been allocated for the purpose of broadcasting television images in black and white. These television channels are within the frequency bands from 54 to 88 mc. (megacycles) and from 174 to 216 mc. For the reception of such television images these two widely separated frequency ranges must be covered by a high frequency tuner forming part of a television receiver. In the future it is expected that television images in colors will be transmitted over a still higher frequency range. At the present time, the frequency band between 490 and 600 mc. has been reserved for experimental purposes in connection with color television. It is accordingly desirable to provide a single high frequency tuner which will cover, for example, these three widely spaced high frequency ranges. Such a high frequency tuner should preferably operate in the manner of a spread-band tuner whereby a desired frequency range is expanded or spread out while intermediate, undesired frequency ranges are compressed. The present invention provides a tuner which will permit tuning of such widely spaced frequency ranges between approximately 50 and 700 mc.

It is accordingly an object of the present invention to provide a resonant structure for varying the tuning response of an electrical circuit over a wide frequency range such as, for example, between approximately 50 and 700 mc.

A further object of the invention is to provide a resonant structure electrically equivalent to a resonant circuit and which has a resonant frequency variable essentially by a variation of the inductance of the structure.

Another object of the invention is to provide a variable resonant structure where equal movements of a movable element will result in either a rapid or a slow variation of the resonant frequency whereby a desired frequency range may be spread out while an undesired frequency range may be compressed.

A still further object of the invention is to provide a variable resonant circuit or structure in which capacity contact elements remain fixed in position and only an inductance member is physically moved in the process of tuning.

A variable resonant structure for varying the tuning response of an electrical circuit in accordance with the invention comprises an inductor, the inductance of which per unit of length varies in a predetermined manner along its length. The inductor consists essentially of a spiral metallic ribbon of variable width disposed about a suitable insulating support and having a predetermined variable pitch. Two metallic members are spaced apart from each other and are spaced from the inductor by a dielectric such as air or a suitable low-loss insulating material. These two metallic members are electrically connected together or to other circuit elements and each forms a capacitance with the inductor. The resonant frequency of the structure which is defined by the inductance between the metallic members and by their capacitances with the inductor may be varied by moving the inductor. The two metallic members may form part of an integral structure such as a metallic chamber which serves the purpose to decouple the portion of the inductor within the chamber from the remainder of the inductor.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4, 5, 6:
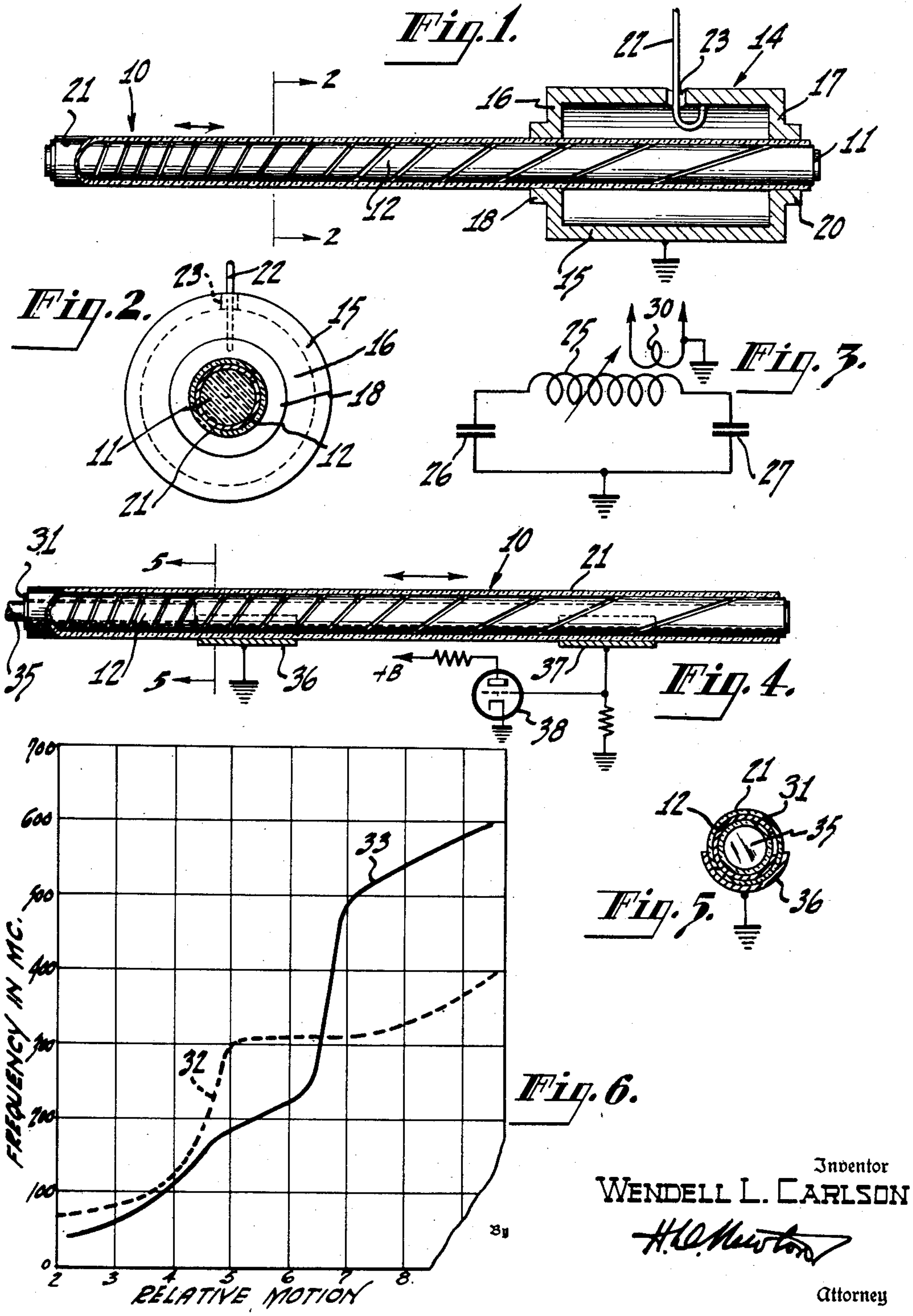
Figure 1 is an elevational view, partly in section, of an electrical variable resonant tuning structure embodying the present invention.
Figure 2 is a cross-sectional view, on an enlarged scale, of the structure of Figure 1, taken on line 2—2 of Figure 1.
Figure 3 is an equivalent circuit diagram of the structure of Figure 1.
Figure 4 is an elevational view, with parts broken away, of a modified variable resonant tuning structure in accordance with the invention.
Figure 5 is a cross-sectional view, on an enlarged scale, of the structure of Figure 4, taken on line 5—5 of Figure 4.
Figure 6 is a graph showing curves which illustrate by way of example the relation between the resonant frequency of the tuner of the invention and the relative motion of a movable element thereof for two different inductors.

Referring now to the drawing in which like components are designated by the same reference numerals, and particularly to Figures 1 and 2, there is illustrated a variable resonant structure in accordance with the invention. The resonant tuning structure includes an inductor generally indicated at 10. Inductor 10 comprises rod 11 which may be solid as shown in Figure 2 and which consists of a suitable insulating material. A tapered metallic ribbon 12 is disposed spirally about rod 11 and may consist of any material which is a good conductor of electricity such, for example, as copper. As clearly shown in Figure 1, ribbon 12 has a predetermined varying width which provides a predetermined varying winding pitch. The individual windings of ribbon 12 are insulated from each other by a fixed spacing. Accordingly, the inductance of a unit length of inductor 10 on the left hand side of Figure 1 may be made higher than that of a corresponding portion on the right hand side of the figure.

In accordance with the present invention, a chamber generally indicated at 14 encloses a portion of inductor 10. Chamber 14, as shown in Figure 1, may comprise cylinder 15 having two annular flat end portions 16 and 17 which are provided with guide bearings 18 and 20 of substantially cylindrical shape for the inductor 10. The whole chamber 14 may consist of a single piece of metal.

Bearings 18 and 20 are electrically connected together and form two spaced members, each of which provides a capacitance with inductor 10. To this end, bearings 18 and 20 and inductor 10 should be spaced from each other by a suitable dielectric such as air. Chamber 14 may be grounded as shown. Preferably, a low-loss insulating material 21 is provided to increase the capacitance between inductor 10 and chamber 14. Layer 21 may cover inductor 10 as clearly shown in the drawing. Insulating layer 21 may, for example, consist of styrene. Instead of coating ribbon 12 with an insulating layer 21 it is also feasible to provide an insulating layer on bearings 18, 20 which spaces them from ribbon 12.

A suitable electro-magnetic pickup element may be provided within chamber 14. The pickup element may, for example, consist of a probe 22 extending through a suitable opening 23 in chamber 14. Probe 22 is coupled to inductor 10. The pickup element may also provide capacity coupling to the rod or inductor 10 as an alternative means for connecting to other circuits, such as an oscillator or an amplifier.

Figure 3 illustrates the equivalent circuit of the variable resonant structure of Figure 1. Variable inductor 25 represents the inductance of inductor 10 enclosed within chamber 14, that is, between bearings 18 and 20. Capacitors 26 and 27 represent the capacitances between bearing 18 and inductor 10 and between bearing 20 and inductor 10 respectively. Chamber 14 may be grounded at a suitable point as indicated in Figure 3. Coil 30 coupled to inductor 25 schematically represents probe 22.

The operation of the resonant structure of Figures 1 and 2 will now be evident. By moving inductor 10 to the left or right the inductance of the portion of inductor 10 enclosed within the chamber will vary. Thus, when chamber 14 is in the position shown in Figure 1 the structure will be resonant at a high frequency. On the other hand, if inductor 10 is moved to the right, the structure will resonate at a lower frequency due to the higher pitch and the larger inductance of the portion of inductor 10 within the chamber.

Curve 32 of Figure 6 illustrates a particular, desirable relationship between the relative motion of chamber 14 and the resonant frequency (in mc.) of the structure as obtained in an experimental design. The tuning range was between 70 and 400 mc. It will be seen that a particular frequency range between approximately 100 and 300 mc. is compressed while other frequency ranges between 70 and 100 mc. and between 300 and 400 mc. are spread out. Curve 33 indicates a tuning curve which is particularly suitable for covering the three television bands of 54 to 88 mc., 174 to 216 mc. and 490 to 600 mc. The undesired frequency ranges between these television bands are compressed as clearly shown in the drawing. For other applications it may be desirable to have a constant change in frequency with motion which can be achieved by suitable design of the inductor 10. A large range of frequency coverage and various desired rate of frequency changes with motion can be obtained by varying the pitch and width of metal ribbon 12 and the length of the tuning rod or inductor 10. It is also feasible to exchange inductor 10 for another inductor to obtain a different tuning curve.

Figures 4 and 5 illustrate a modified tuning structure in accordance with the invention. Inductor 10 comprises an insulating support 31 which consists of a hollow cylinder as clearly shown in Figure 5. Ribbon 12 is disposed about cylinder 31 and is covered by a dielectric coating 21. A ferromagnetic core 35 may be disposed in support 31 to change or adjust the tuning curve by increasing the effective inductance of a particular portion of the inductor. It is to be understood that support 11 of the structure of Figures 1 and 2 may be hollow, and a core 35 may be disposed therein.

Instead of providing a closed chamber 14 the structure of Figures 4 and 5 is provided which features a pair of capacity elements 36 and 37 in the form of complete cylinders or half cylinders as shown. These capacity elements are the same as 26 and 27 in Figure 3 and they may be connected together and grounded as in Figure 3. Alternatively, one of the elements such as 36 may be grounded and the other connected to a grid input circuit of a tube 38 as shown in Figure 4.

The structure of Figures 4 and 5 operates in the same manner as previously described. Plates 36 and 37 each form again a capacitance with inductor 10. Of course, the portion of inductor 10 between plates 36 and 37 is not as effectively decoupled from the remainder of inductor 10 as in the construction of Figures 1 and 2.

There has thus been disclosed an improved variable resonant structure which will operate over a very wide frequency range. The structure may be tunable, for example, between 50 and 700 mc. and does not require switching or sliding electric contacts which are a source of erratic operation.

What is claimed is:

1. A variable resonant structure for varying the tuning response of a high frequency electrical circuit over a relatively wide high frequency range comprising a ribbon conductor disposed spirally about a fixed axis with a predetermined varying pitch to provide an elongated spiral inductor, the inductance of which varies in a predetermined manner along said axis, two conductive members spaced a distance of several conductor widths apart from each other and near said inductor, a dielectric spacer between said members and said inductor, thereby to form two capacitances with said inductor, and means for relatively moving said inductor and said members in the direction of the axis to bring different portions of the spiral inductor between said members.

2. A resonant structure as defined in claim 3 wherein a ferromagnetic core is disposed axially within said inductor and support.

3. A variable resonant structure for varying the tuning response of a high frequency electrical circuit comprising a substantially straight tubular insulating support, a metallic ribbon of varying width disposed spirally about said support with a predetermined varying pitch to provide an elongated spiral inductor, the inductance of which varies in a predetermined manner along said support, two metallic members spaced a fixed distance apart from each other and near said inductor, a dielectric spacer between said members and said inductor, thereby to form two capacitances with said inductor, means for relatively moving said support and said metallic members, and signal pickup means coupled to the varying pitch portion of said inductor between said members, for connecting the variable number of turns of said ribbon between said members to other circuits.

4. A variable resonant structure for varying the tuning response of a high frequency electrical circuit comprising a substantially straight insulating rod, a metallic ribbon of varying width disposed about said rod in a winding with a predetermined varying pitch to provide an inductor, two metallic members spaced a fixed distance apart from each other, a layer of dielectric insulating material disposed on said ribbon to space said members from said inductor, thereby to form two capacitances with said inductor, said members being electrically connected, and relatively movable jointly with respect to said rod, and a pickup probe in electrical coupling relation to said inductor between said members.

5. A variable resonant structure for varying the tuning response of an electrical circuit comprising an insulating support, a metallic ribbon disposed about said support with a predetermined varying pitch to provide an inductor, the inductance of which varies along said support in a predetermined manner, means providing a metallic chamber enclosing a portion of said inductor and having two end portions spaced from each other and closely spaced with respect to said inductor, dielectric means between said portions and said inductor, thereby to provide two capacitances with said inductor, a probe disposed in said chamber and coupled to said inductor, and means adapting said support for relative motion within and through said chamber thereby to vary the number of turns and the effective inductance of the portion of said inductor enclosed by said chamber.

6. A variable resonant structure for varying the tuning response of a high frequency electrical circuit comprising a substantially straight rod of insulating material, a metallic ribbon of a width varying in a predetermined manner and spirally disposed about said rod with a predetermined varying pitch to provide an elongated inductor, the inductance of which varies along said rod in a predetermined manner, means providing a metallic chamber surrounding a portion of said inductor and having two cylindrical end portions spaced from each other along the inductor closely adjacent thereto, a dielectric layer on said ribbon for spacing said portions mechanically from said inductor and providing two capacitances with said inductor, a probe disposed in said chamber and coupled electrically to said inductor, and means for relatively moving said inductor through said chamber, said ribbon width and pitch thereby varying within said chamber in such a manner that uniform longitudinal movement of said inductor provide a constantly changing rate of variation of the resonant frequency of said structure.

7. A high frequency tuning structure for electrical signal circuits comprising means providing an elongated cylindrical chamber having a longitudinal axis, a helically wound conductor of uniform diameter extending longitudinally of and through the ends of said chamber along said axis, said conductor being of varying winding pitch and movable axially to vary the inductance included in said chamber between said ends, and means providing capacitive coupling at said chamber ends with said conductor.

8. A high frequency tuning structure for electrical signal circuits, comprising means providing an elongated cylindrical chamber having a longitudinal axis, a helically wound flat ribbon conductor of uniform diameter extending longitudinally of and through the ends of said chamber along said axis, said conductor being of varying width and winding pitch and moveable axially to vary the inductance included in said chamber between said ends, and means providing capacitive coupling at said chamber ends with said conductor.

9. A variable tuning structure for varying the frequency response of an electrical circuit over a relatively wide high-frequency range, comprising an insulating support, a tapered conductive helical ribbon disposed about and along said support with a predetermined varying pitch and fixed spaced between turns of the ribbon to provide a single layer inductor, the inductance of which per unit of length varies in a predetermined manner along said support, two conductive members spaced a fixed distance apart from each other along and adjacent to said inductor, dielectric means interposed between said members and said inductor, thereby to provide effectively two capacitances with said inductor, means adapting said support and inductor for relative motion with respect to said members to vary the ribbon pitch and number of helical turns between said conductive members, thereby to vary the frequency response of said structure of the movement between said inductor and said members.

WENDELL L. CARLSON.

References Cited in the file of this patent

UNITED STATES PATENTS

| Number | Name | Date |
| --- | --- | --- |
| 2,390,009 | Stott | Nov. 27, 1945 |
| 2,394,391 | Martowicz | Feb. 5, 1946 |
| 2,414,280 | Thomas | Jan. 14, 1947 |
| 2,518,930 | Polydoroff | Aug. 15, 1950 |
| 2,562,263 | Ehrlich | July 31, 1951 |

FOREIGN PATENTS

| Number | Country | Date |
| --- | --- | --- |
| 439,147 | Great Britain | Nov. 29, 1935 |
| 561,787 | Great Britain | June 5, 1944 |